United States Patent
Yazdinia

(10) Patent No.: US 9,274,165 B2
(45) Date of Patent: Mar. 1, 2016

(54) TESTER FOR LIGHTNING ARRESTERS COUNTER

(71) Applicant: Seyed Hasan Yazdinia, Isfahan (IR)

(72) Inventor: Seyed Hasan Yazdinia, Isfahan (IR)

( * ) Notice: Subject to any disclaimer, the term of this patent is extended or adjusted under 35 U.S.C. 154(b) by 457 days.

(21) Appl. No.: 13/732,366

(22) Filed: Dec. 31, 2012

(65) Prior Publication Data

US 2014/0184232 A1    Jul. 3, 2014

(51) Int. Cl.
*G01R 31/327*    (2006.01)
*G01R 31/28*    (2006.01)
*H02H 3/04*    (2006.01)

(52) U.S. Cl.
CPC ........ *G01R 31/2839* (2013.01); *G01R 31/2827* (2013.01); *H02H 3/044* (2013.01); *G01R 31/3277* (2013.01)

(58) Field of Classification Search
None
See application file for complete search history.

(56) References Cited

U.S. PATENT DOCUMENTS

| 3,469,188 | A |   | 9/1969 | Hall |
| 3,530,336 | A | * | 9/1970 | Pippen ...................... 315/241 R |
| 4,075,549 | A | * | 2/1978 | Woodward ................... 324/418 |
| 4,338,648 | A |   | 7/1982 | Subbarao |

FOREIGN PATENT DOCUMENTS

CN        202330686 U  *  7/2012

OTHER PUBLICATIONS

Machine English translation of Chinese Patent Publication to Inventor C Ma. CN 202330686 U, Jul. 11, 2012. Translation of pp. 3-4 created on Feb. 4, 2015.*

* cited by examiner

*Primary Examiner* — Melissa Koval
*Assistant Examiner* — Stephen G Armstrong
(74) *Attorney, Agent, or Firm* — Azadeh Saidi

(57) ABSTRACT

The designed circuit is used for testing all kinds of discharge counter for lightning arresters. Discharge counter for lightning arresters are used in substation and all power plants with various voltages and discharge currents. The lightning arresters counter tester creates the needed voltage and current that operates the counter and simulates the conditions that the counter works in; therefore it can be concluded whether the counter works well or not.

10 Claims, 1 Drawing Sheet

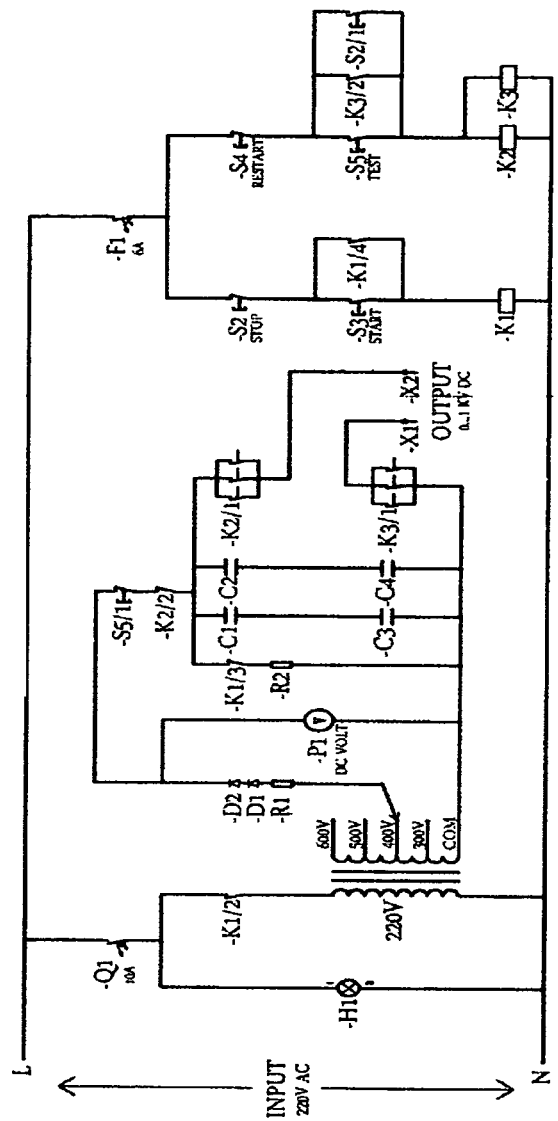

TESTER FOR LIGHTNING ARRESTERS COUNTER

BACKGROUND OF THE INVENTION

U.S. Pat. No. 3,469,188 A (Hall) describes a circuit for use with lightning arresters to provide a measure of the grading current and leakage current associated with the arresters as well as to count the number of surges occurring through the arresters and also in U.S. Pat. No. 4,338,648 (Subbarao) describes gapless discharge counter for lightning arresters.

The discharge counter is connected between the surge arrester and ground, monitors the steady state current by means of an ammeter and records the number of discharges by means of a capacitor, cyclometer coil, and a recorder. Regarding These parameters the accuracy or having malfunction in lightning arresters can be determined.

The lightning arresters are used in substations to protect the equipment against the excessive voltage that are produced because of surge or switching. Considering that there was no device for testing the accuracy of discharge counter function, there was no insurance that the counter worked well or not. Therefore the accuracy of the lightning arrester function wasn't specified because of the lack of a secure and accurate monitoring done by discharge counter. It's very important to know that if the lightning arresters don't work well, a lot of irreparable accidents can occur to the system. So; the accuracy of the discharge counters function is very important. Therefore inventing a device for testing the accuracy of discharge counters function was seen very important.

BRIEF SUMMERY OF THE INVENTION

This invention is related to testing of various kinds of discharge counters to find out the accuracy of discharge counter function. Using this device it can be made sure that various kinds of discharge counters and lightening arresters in high voltages work well or not.

BRIEF DESCRIPTION OF THE DRAWINGS

FIG. 1 displays the diagram of the circuitry of the invented device.

DETAILED DESCRIPTION OF THE INVENTION

When fuse Q1 is connected to an input voltage 220 VAC, it supplies the power circuit and an H1 lamp which turns on, this shows the fuse works well and the input voltage is connected. By pushing a start button (S3), contactor K1 is energized and auxiliary contacts of K1 (K1/2, K1/3, K1/4) get actuated as well and the input voltage supplies primary transformer. The power supply transformer (between Line and null inputs "L" and "N" respectively) is an increasing transformer (220V/300-400-500-600-700 V). Depending on the state of voltage charge selector, the chosen voltage after passing resistance R1 (10 W/47 KΩ) and diodes D1, D2 (1 KV/3 A) gets rectified in a half wave form and capacitor C1, C2, C3, C4 start to charge.

Capacitor C1, C2, C3, C4 are the same (AC 50 HZ 400V 25 KVAR C=3×166 µF). The value of the capacitors charge voltage is shown by dc voltmeter P1.

When the voltage of capacitors reaches a considered value, with pushing the test button (S5 and S5/1 that act together) contactors K2 and K3 are energized and by connecting main contacts of K2, K3 (K2/1, K3/1) and also auxiliary contacts of K2, K3 (K2/2, K3/2) the capacitors charged voltage will be discharged to the output terminals X1, X2 as an impulse wave. Terminal X2 is connected to the input of a discharge counter and terminal X1 is connected to the output of discharge counter.

When impulse wave discharges to the discharge counter, cyclometer coil of discharge counter gets actuated and the number of cyclometer goes to one digit higher and this shows that the counter works well. Of course this test should start with the lowest voltage (300 V). And if the cyclometer of counter isn't actuated, a higher voltage should be selected. With pushing the restart button S4 the capacitors will start to charge with a higher voltage and after reaching the considered voltage, by pushing a test button (S5) the voltage comes in to the counter again.

If the counter's cyclometer doesn't work, this process will be repeated so that the voltage reaches its maximum range. The malfunction of counter's cyclometer is a sign of counter malfunction and the counter needs to be changed.

Finally at the end of the test, with pushing a stop button (S2) contactor K4 would stop from actuating and resistance (R2) will be paralleled with the capacitors and the remaining voltage in the capacitors would be discharged to resistance (R1).

It is understood that the above description and drawings are illustrative of the present invention and that changes may be made in the resistance and capacitors and the circuit without departing from the scope of the present invention as defined in the following claims.

I claim:

1. A tester for lightning arresters counter comprising a fuse connected to an input voltage, providing power supply to an electrical circuitry and an indicator lamp; wherein when said lamp is on, said tester is in working condition; energizing a first contactor and primary transformer; wherein said power supply comprises an increasing transformer; wherein said transformer comprises different voltages of 300V, 400V, 500V, 600V, 700V; wherein a voltage selector selects one of said different voltages; said different voltages pass through a first resistance; being rectified by a first and second diode in a half wave form; therefore charging four capacitors; wherein said four capacitors are all the same and wherein voltage charge value of said four capacitors are displayed by a DC voltmeter.

2. The tester of claim 1, wherein when said voltage charge value of said four capacitors reaches a sufficient and predetermined value a testing process starts and therefore a second and third contactors are energized and said four capacitors are discharged through a first and second output terminals as an impulse wave.

3. The tester of claim 2, wherein said second output terminal is connected to an input of a discharge counter and wherein said first output terminal is connected to an output of said discharge counter.

4. The tester of claim 3, wherein said discharge counter comprises a cyclometer coil; and wherein said impulse wave discharges to said discharge counter and said cyclometer coil is actuated and therefore said discharge counter displays one digit higher than before indicating said discharge counter works well.

5. The tester of claim 4, wherein said testing process starts at voltage 300V.

6. The tester of claim 5, wherein if said discharge counter is not actuated a higher voltage is selected.

7. The tester of claim 6, wherein when said testing process is restarted said four capacitors recharge with said higher voltage; and wherein when said voltage charge value of said four capacitors reaches a sufficient and predetermined value said testing process starts.

8. The tester of claim 7, wherein if said discharge counter is not actuated said testing process is repeated till said four capacitors are charged with maximum value of said higher voltage; if said maximum value does not actuate said discharge counter said discharge counter is not in working condition and needs to be changed.

9. The tester of claim 8, wherein said testing process is stopped by pressing a stop button where a four contactor is not actuated anymore and a second resistance will be paralleled with said four capacitors, therefore discharging a remaining voltage of said four capacitors to said first resistance.

10. The tester of claim 9, wherein said input voltage is 220 VAC, and wherein said first resistance is 10 W, 47KΩ and wherein said first and second diodes are 1 KV/3 A, and wherein said four capacitors are AC, 50 HZ, 400V, 25 KVAR, C=3×166 µF.

* * * * *